United States Patent [19]

Bergmann et al.

[11] Patent Number: 4,749,587
[45] Date of Patent: Jun. 7, 1988

[54] PROCESS FOR DEPOSITING LAYERS ON SUBSTRATES IN A VACUUM CHAMBER

[75] Inventors: Erich Bergmann, Mels, Switzerland; Elmar Hummer, Satteins, Austria

[73] Assignee: Balzers Aktiengesellschaft, Liechtenstein

[21] Appl. No.: 876,274

[22] Filed: Jun. 19, 1986

[30] Foreign Application Priority Data

Jun. 20, 1985 [CH] Switzerland ............... 02610/85

[51] Int. Cl.$^4$ ............................................. B05D 3/06
[52] U.S. Cl. ........................................ 427/37; 427/47; 427/248.1; 427/249; 427/255.2; 427/255.3
[58] Field of Search ............... 427/37, 39, 47, 252, 427/248.1, 249, 255.1, 255.2, 255.3

[56] References Cited

U.S. PATENT DOCUMENTS

| | | | |
|---|---|---|---|
| 679,926 | 8/1901 | Voelker | 427/37 |
| 3,573,098 | 3/1971 | Bieber et al. | 427/37 |
| 3,625,848 | 12/1971 | Snaper | 427/37 |
| 4,512,867 | 4/1985 | Andreev et al. | 427/37 |
| 4,540,596 | 9/1985 | Nimmagadda | 427/37 |
| 4,551,221 | 11/1985 | Axenov et al. | 427/37 |
| 4,559,121 | 12/1985 | Mularie | 427/47 |
| 4,622,452 | 11/1986 | Bergman et al. | 427/37 |

Primary Examiner—Sadie L. Childs
Attorney, Agent, or Firm—McGlew and Tuttle

[57] ABSTRACT

In the previously used methods for the deposition of layers on surfaces by means of chemical reactions with gases, which are introduced into the reaction room or chamber (chemical vapor deposition, CVD), electrical glow discharge and mainly high-frequency discharges were used for the activation of the reactants. According to the invention, the maintaining of a low-voltage arc discharge in the reaction room during the coating is recommended. The surprising result of this is a considerably stronger activation and ionization and a more uniform coating also on surfaces of complex shape.

5 Claims, 1 Drawing Sheet

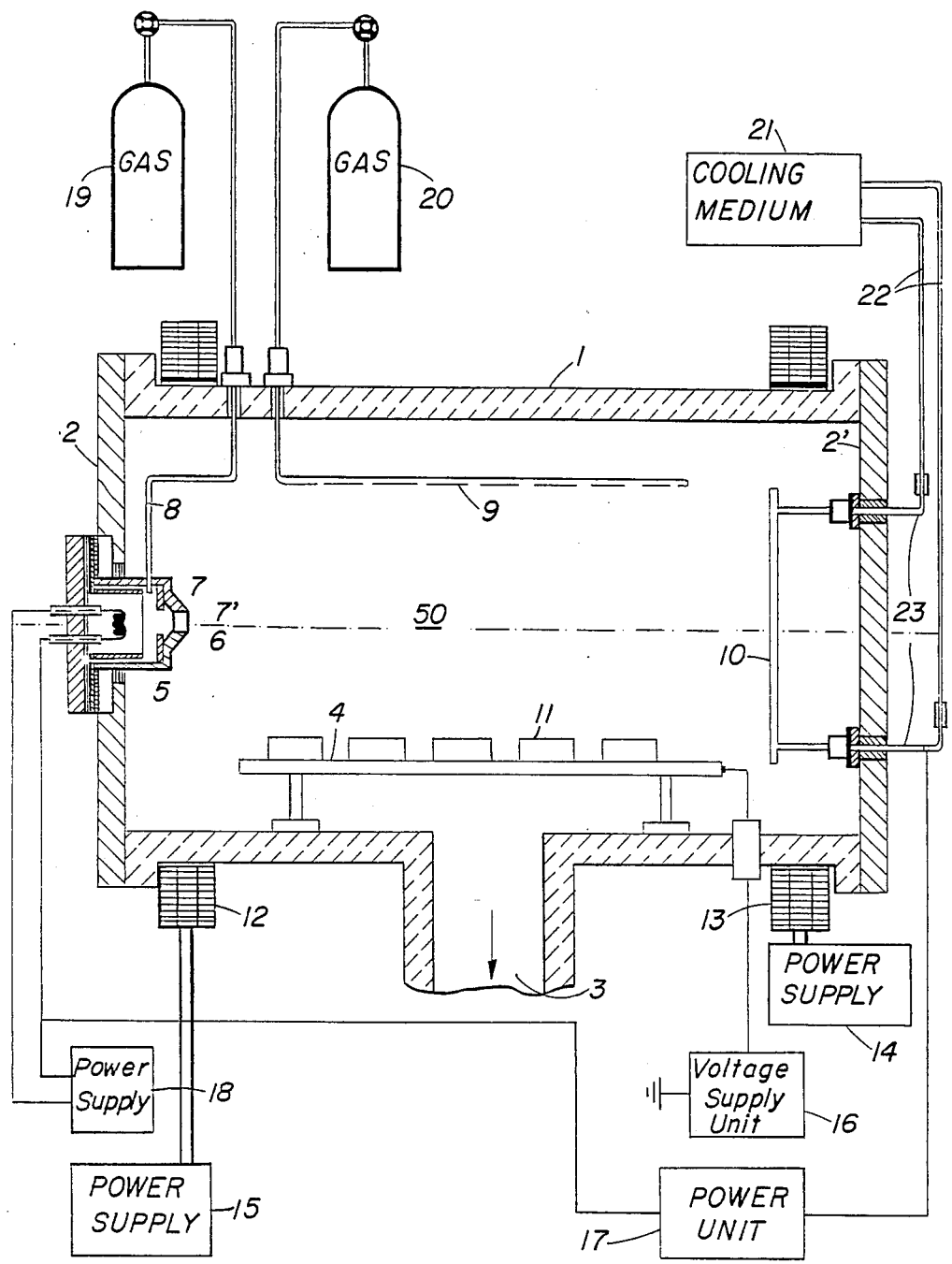

PROCESS FOR DEPOSITING LAYERS ON SUBSTRATES IN A VACUUM CHAMBER

FIELD AND BACKGROUND OF THE INVENTION

This invention relates in general to substrate coating and in particular to a new and useful process for depositing a layer on substrates in a vacuum chamber.

The present invention concerns a process for depositing a layer on substrates in a vacuum chamber by which the chemical reactants of the substance forming the layer are introduced in gaseous form into the vacuum chamber, activated and partly ionized by an electrical gas discharge in the space in front of the substrate surface to be coated and applied to the substrate surface for the layer-forming reaction.

The deposition of metals or compounds from a gaseous phase reaction has been known for a long time and has become a widely used industrial manufacturing technique during the last decades. In the most widely used thermochemical and pyrolytic variant, gases are decomposed into layers on hot surfaces. The processes with inorganic starting materials, e.g. the metallic halides, require relatively high temperatures which does not allow their application to most of the substrate materials. Typical temperature for these are 800°–1,000° C., i.e. temperatures that are above the tempering temperatures of most steels and are also unsuitable for non-ferrous metals or aluminum alloys.

To circumvent this problem, less stable organometallic compounds have been used as starting materials until now and/or the reaction partners were activated by an electric gas discharge in the space in front of the surface to be covered by a layer. When such reactions are carried out in a high-frequency gas discharge, the reaction products frequently precipitate in the form of a fine powder, depending on the pressure and temperature conditions in the reaction chamber (German Pat. No. 731,318), but they can also be precipitated as coating on substrate surfaces. When the temperature is lowered, which was possible with high-frequency excitation and with the use of readily decomposable organometallic reactants, the pressure in the reaction chamber must be reduced correspondingly also to adjust a proper equilibrium between the coating of the substrate surfaces on the one hand and the powder synthesis in the gas space on the other hand.

But as recent accidents have demonstrated, the use of organometallic compounds is hardly justifyable because of their poisonous character. Consequently during the last few years the only practical alternative to the purely physical coating processes such as metallizing under vacuum or cathode evaporation, was the activation by an HF-discharge. But even this HF-process for the precipitation of layers by a chemical reaction between a gas introduced into the reaction chamber and the substrate to be coated or among several introduced gaseous reactants, in which case the reaction product precipitates as deposit on the substrate surface, still has considerable disadvantages. Among these are especially the high costs of efficient generators that shielded, as required by law. The introduction of high frequency into the reaction chamber without great losses is also difficult, particularly when the parts to be covered are held by rotating carriers during the coating. Another difficulty is the requirement that, for a uniform coating, the plasma density be as homogeneous as possible in the space in front of the surface to be coated, which frequently cannot be achieved with parts of complex shapes, e.g. tools, however. Differences in the thickness and the quality of the layer at various points of the same piece of work are the consequence.

This was the reason for attempts to perform such coating processes in direct-current discharges of the diode type, but these failed because of the high accelerating voltags for the (electrically charged) radicals occurring during this process, which probably resulted in undesirable secondary reactions.

For the so-called ion plating, metals are vaporized by heating and simultaneously ionized to a small degree in a plasma, by which the produced positive ions are accelerated in the direction of the substrates laid on a negative potential. The result are coatings with better adhesion to the substrates. The depositing of chemicals is also possible by this method, provided that an active gas is introduced simultaneously into the vaporizing chamber. For example, nitride layers can be deposited by vaporizing titanium in a nitrogen atmosphere.

But this process could be used only for the production of those compounds that could be obtained by the reaction of a metal vaporized at a high temperature with the active gas atmosphere. The high temperature of the vaporized metal resulted in high substrate temperatures due to heat radiation, necessitating costly cooling and making the coating of some substrates with compounds from metals with high melting points impossible by this method. The generating and handling of the metallic melt in the active atmosphere is also costly and difficult.

A summarizing description of the process for the preparation of metallic protective coatings by gas phase reactions (chemical vapor deposition-abbreviation CVD used in the following text) is found, e.g., in Int. Metals Reviews 1978, No. 1, p. 19. The preparation of non-metallic coatings by plasma-supported deposition from the vapor phase is described in a report by K. R. Linger in AERE, Harwell, Didcot, Oxon, OX 11 ORA.

SUMMARY OF THE INVENTION

In contrast to this known state of the art, the present invention has as its objective a new possibility of the plasma-supported deposition of firmly adhering layers by a CVD process on substrates, e.g. tools, which does not have the disadvantages of the known HF-process and results in an activation and ionization of all components taking part in the reaction at least equal in magnitude and frequently even greater, which results in better mechanical characteristics of the layers and allows a faster deposition.

The invention is characterized by the fact that the activation and ionization of the reactants is brought about by a low-voltage arc discharge and that the produced ions are accelerated toward the substrate surface by an electrical field.

The present invention allows for the first time the activation of a CVD-process with plasma without having to accept the disadvantages and problems of the HF-technology. The use of a low-voltage arc allows the filling of the entire reactor chamber with a homogeneously dense plasma, at a low electrical output since high voltage and high frequency are not needed.

Accordingly, it is an object of the invention to provide an improved process for the deposition of layers on substrates in a vacuum chamber which comprises effecting a low voltage arc discharge in the chamber contained in the substrate and the reactants so as to produce ions of the material to be applied to the substrate and accelerating the produced ions in the direction toward the substrate surface by an electric field.

A further object of the invention is to provide a process for effecting the coating of substrates which is simple to carry out, economical in respect to the end product and to the process of its decoating and efficient in respect to the end product which is produced.

BRIEF DESCRIPTION OF THE DRAWING

In the Drawing: The only FIGURE of the drawings is a sectional view of a vacuum chamber for carrying out the process of the invention.

DESCRIPTION OF THE PREFERRED EMBODIMENTS

Referring to the drawings in particular, the invention embodied therein comprises a chamber or room generally designated 50 which is provided for coating substrates 11 in accordance with the process of the invention.

A cylindrical reaction chamber comprises a glass jacket part 1 and two metal plates 2 and 2' attached to flanges at each end of the jacket part 1. This reaction chamber can be evacuated through a pump connection 3 and has a substrate holder 4 in its interior. Located adjacent an end of hot cathode chamber 5 for a hot cathode tube 6, which is closed off against the reaction room on the side facing the reaction chamber by a funnel-shaped part 7 that has a central opening 7'. As can be seen, a gas pipe 8, through which a protective gas for the hot cathode tube, e.g. argon, can be introduced, leads into the hot cathode tube chamber 5. Another gas pipe 9 enters directly into the reaction room and is used for the introduction of the reaction gas or gas mixture needed for the intended layer. A plate- or rod-shaped anode 10 is attached to the front wall of the cylindrical reaction room opposite the hot cathode tube chamber in the reaction chamber. A low-voltage arc discharge is maintained between the anode and the hot cathode tube during the coating operation, which deposits the desired layer on the substrates 11.

Magnet coils 12 and 13 are also provided, which have the task of focusing the low-voltage arc discharge along the axis of the system; coils 12 and 13 are supplied by power supply apparatus 14 and 15 respectively. As can be seen, the flow direction of the reaction gas introduced through line 9 is largely vertical to the direction of the magnetic field.

During deposition the possibility must be given for applying to the substrates a suitable voltage with respect to the reaction chamber and the arc plasma, provided by the voltage supply unit 16. The power for the arc discharge between the anode and the hot cathode tube is supplied by a power supply unit 17.

The drawing also shows a power supply unit 18 for supplying the hot cathode tube with the required heating current, also a storage vessel 19 for the protective gas to be introduced into the hot cathode tube chamber and another storage container 20 for a reaction gas (or gas mixture). Number 21 is an apparatus that provides a cooling medium e.g., cooling water, which is circulated through the anode equipped with cooling spaces. Copper tubes 23, supported by the front wall of the reaction room at the side of the anode and suspended in insulation material are used to lead through this front wall and serve simultaneously to feed the electric current supplied by unit 17 to the anode of the low-voltage arc discharge.

For the preparation of coatings, the described system is loaded with the pieces or substrates 11 to be coated by placing these on the substrate holder 4. The chamber is evacuated until the gas pressure has dropped below 1 centipascal. Prior to the coating, the surfaces to be covered are subjected to a so-called ion etching for a better adhesion. Several known etching methods may be used, such as high-voltage diode or triode direct-current etching, and the etching can be carried out either in a neutral gas or, for the purpose of removing specific contaminants, in an active gas, e.g. hydrogen. The auxiliary systems for performing such an etching process or other cleaning processes for the surfaces to be coated can be located in the reaction chamber or room. (since etching and cleaning processes are not the actual subject of the present invention, these are now shown in the attached drawing, which is intended to show only the basic system for carrying out the process according to the invention.) However, the etching is carried out most simply by using the electrodes already present, e.g. the etching can be caused by a direct-current discharge between the grounded substrates 11 and anode 10. A correspondingly high positive potential must be applied temporarily to the anode for this purpose, which is used to maintain a glow discharge toward the surfaces to be cleaned with a discharge current of several mA at a correspondingly low pressure in the reaction chamber.

After etching or cleaning the surfaces to be coated, these are heated to the temperature required for the process. Special heating equipment (not shown in drawing) can be used for this purpose, or a corresponding heating effect can be obtained with the aid of the low-voltage arc discharge between hot cathode tube 6 and anode 11. Ways of measuring the temperature should be provided since experience has shown that an adjustment of the temperature accurate to $\pm 2°$ C. should be recommended for a precise operation of the coating process. A neutral gas atmosphere, e.g. argon, can be maintained in the entire reaction chamber during preheating.

For the performance of the actual coating process in the described system, a low-voltage arc is maintained between the hot cathode tube, which is mainly on ground potential and was heated with 1.8 kw in the example, and the anode while a potential of 78 v against ground was required at the anode. But this potential is continuously adjusted or regulated to provide an arc current of preset magnitude, e.g. 115 A. When the negative potentials given in the following practical examples are applied to the holder 4 through direct-current supply unit 16, which is connected to the holder, and when the reaction gases are fed into the chamber in the amounts given in the examples, the layer begins to build up on the surfaces to be covered. The flow of argon through the hot cathode chamber is kept constant during this time. The pressure developing in the reaction chamber is the result of the equilibrium of pumping performance, condensation rate and flow of gas. When, after a certain time, the desired layer thickness (which can be continuously monitored with instruments measuring the thickness of the layer (not shown in the drawing) has been reached, the arc discharge is turned off and the building up of the layer is thus stopped.

In the attached table containing 12 examples, the first four columns show the type and amount of reaction gases introduced into the reaction room. The next column shows the substance of which the layer obtainable with these reaction gases consists. The subsequent columns indicate the potential at the surfaces to be coated (e.g. at holder 4 for the pieces to be coated or other substrates to be covered) required for the preparation of the layer in the coating apparatus and the time that was needed to let the layer build up to the recorded thickness. The last column finally indicates some applications, in key terms, for which the respective layers appear to be particularly suitable. As is apparent, layers No. 1 to 3 can be used especially as protective layers against wear and corrosion. Layer No. 4 of silicon is suitable mainly for sun shade cells and for semiconductor building elements. The other listed layers are suitable, e.g., for hardening of cutting tools, to increase their service life. Layers No. 8,11 and 12 can be used for optics and electrotechnology because of their exceptional mechanical and optical as well as electrical properties.

bination with the use of a low-voltage arc as suggested according to the invention. The optimal amperages and operating voltages of the arc discharge naturally vary from case to case, but they are more or less within the order of magnitude given in the examples recorded above and can be readily established with simple preliminary experiments.

What is claimed is:

1. A process for the deposition of at least one layer on a substrate in a vacuum chamber of an evaporation vessel by Chemical Vapor Deposition, comprising introducing chemical reactants of the substance forming the at least one layer into the vacuum chamber in a gaseous form, activating and partly ionizing the reactants by gas discharge in a space adjacent the substrate to be coated so as to induce it to enter into a layer forming reaction on the substrate surface, and effecting the activation and ionization of the reactants by an electric arc discharge to produce ions between an anode and a

| Example | Gas introduced 1 Type | Amount | 2 Type | Amount | Layer | Substrate voltage | Coating time | Layer thickness |
|---|---|---|---|---|---|---|---|---|
| 1 | Benzene | 400 scc/min. | | | diamond-like carbon | 400 v | 1 hr | 6 $\mu m$ |
| 2 | $H_6B_3N_3$ | 310 scc/min. | | | mixture of cubic & hexagonal boron nitride | 350 v | 2 hrs | 4.6 $\mu m$ |
| 3 | $Ni(CO)_4$ | 800 scc/min. | | | nickel | 190 v | 40' | 8 $\mu m$ |
| 4 | $SiH_4$ | 250 scc/min. | | | silicon | 310 v | 30' | 0.5 $\mu m$ |
| 5 | $BCl_3$ | 90 scc/min. | $CH_4$ | 300 scc/min. | boron carbide, $B_4C$ | 380 v | 2½ hrs | 7 $\mu m$ |
| 6 | $TiCl_4$ | 430 scc/min. | $CH_4$ | 640 scc/min. | TiC | 460 v | 40' | 3 $\mu m$ |
| 7 | $WCl_6$ | 170 scc/min. | $BBr_3$ | 310 scc/min. | WB | 520 v | 80' | 2 $\mu m$ |
| 8 | $SiH_4$ | 250 scc/min. | $N_2H_4$ | 410 scc/min. | $Si_3N_4$ | 80 v | 10' | 0.5 $\mu m$ |
| 9 | $NbCl_5$ | 370 scc/min. | $N_2$ | 460 scc/min. | NbN | 610 v | 2 hrs | 3.8 $\mu m$ |
| 10 | $AlCl_3$ | 670 scc/min. | $H_2O$ | 1240 scc/min. | $Al_2O_3$ | 60 v | 90' | 3.1 $\mu m$ |
| 11 | $TiCl_4$ | 90 scc/min. | $O_2$ | 260 scc/min. | $TiO_2$ | 70 v | 8' | 0.05 $\mu m$ |
| 12 | $SiCl_4$ | 120 scc/min. | $O_2$ | 290 scc/min. | $SiO_2$ | 48 v | 12' | 0.07 $\mu m$ |

Low-voltage arcs in the sense of the present description are electrical arc discharges operated with potentials of less than 150 v and amperages of at least 30 A.

In addition to the mentioned examples, numerous others of well-known CVD-processes can be performed successfully with the aid of a low-voltage arc discharge according to the meaning of the present invention. The individual processes, which require certain gaseous starting materials, certain temperatures of the surface to be coated and occasionally also the adherence to additional requirements, are not as such the subject of the invention. However, most of these known processes can, as mentioned, be correspondingly modified in comcathode, and accelerating the produced ion in the direction toward the substrate surface by an electric field.

2. A process according to claim 1, wherein a suitable medium is used to cool the anode.

3. A process according to claim 2, wherein the cathode is positioned out of sight of the substrate.

4. A process according to claim 3, wherein the cathode is located in a separate chamber attached to the evaporation vessel.

5. A process according to claim 1, wherein the gas pressure in the reaction chamber is less than 1 pascal.

* * * * *